(12) United States Patent
Glosser, Jr. et al.

(10) Patent No.: US 9,374,194 B2
(45) Date of Patent: Jun. 21, 2016

(54) TRANSMISSION SYSTEM ERROR DETECTION AND CORRECTION SYSTEM AND METHOD

(71) Applicant: General Electric Company, Schenectady, NY (US)

(72) Inventors: Richard Joseph Glosser, Jr., Salem, VA (US); Michael Glynn Wise, Roanoke, VA (US); Steven James Schmitt, Roanoke, VA (US)

(73) Assignee: General Electric Company, Schenectady, NY (US)

(*) Notice: Subject to any disclaimer, the term of this patent is extended or adjusted under 35 U.S.C. 154(b) by 221 days.

(21) Appl. No.: 14/145,636

(22) Filed: Dec. 31, 2013

(65) Prior Publication Data

US 2015/0188664 A1 Jul. 2, 2015

(51) Int. Cl.
*H03M 13/00* (2006.01)
*H04L 1/00* (2006.01)
*H04L 1/20* (2006.01)
*H03M 13/05* (2006.01)
(Continued)

(52) U.S. Cl.
CPC ............. *H04L 1/0041* (2013.01); *H03M 13/05* (2013.01); *H04L 1/203* (2013.01); *H04L 1/08* (2013.01); *H04L 1/242* (2013.01)

(58) Field of Classification Search
CPC ..... H03M 13/05; H04L 1/0041; H04L 1/242; H04L 1/203; H04L 1/08
USPC ......................................... 714/763, 776, 758
See application file for complete search history.

(56) References Cited

U.S. PATENT DOCUMENTS 6,397,157 B1    5/2002    Hogle et al.
6,879,922 B2    4/2005    Hogle et al.
(Continued)

FOREIGN PATENT DOCUMENTS

EP        1091518 A2    4/2001

OTHER PUBLICATIONS

Nath, "Can Protocol Eases Automotive—Electronics Networking", EDN Electrical Design News, vol. No. 43, Issue No. 17, Aug. 17, 1998.

(Continued)

*Primary Examiner* — Guy Lamarre
(74) *Attorney, Agent, or Firm* — Fletcher Yoder, P.C.

(57) ABSTRACT

One embodiment describes a method for real time error correction in a data transmission system that includes receiving a first communication signal on a first programmable logic device from a second programmable logic device via a first serial link, receiving a second communication signal on the first programmable logic device from the second programmable logic device via a second serial link, in which the first serial link and the second serial link are disposed in parallel with each other and are configured to communicate over a single conduit, and the first communication signal and the second communication signal are representative of identical information. The method further includes comparing the first communication signal and the second communication signal in the first programmable logic device to detect an error in data in the first communication signal, the second communication signal, or both, and when the error is detected, correcting the error in real time in the first programmable logic device based at least in part on the comparison of the first communication signal and the second communication signal.

20 Claims, 7 Drawing Sheets

(51) Int. Cl.
*H04L 1/08* (2006.01)
*H04L 1/24* (2006.01)

(56) References Cited

U.S. PATENT DOCUMENTS

| | | | |
|---|---|---|---|
| 7,178,069 B2 * | 2/2007 | Hashimoto | G06F 11/0736 701/1 |
| 7,343,744 B2 | 3/2008 | Abelson et al. | |
| 7,642,748 B2 | 1/2010 | Glosser, Jr. et al. | |
| 2013/0318406 A1 * | 11/2013 | Washio | G08C 25/00 714/715 |

OTHER PUBLICATIONS

European Search Report and Opinion issued in connection with corresponding EP Application No. 141994632 on May 6, 2015.

U.S. Appl. No. 14/145,459, filed Dec. 31, 2013, Richard Joseph Glosser, Jr.

* cited by examiner

TRANSMISSION SYSTEM ERROR DETECTION AND CORRECTION SYSTEM AND METHOD

BACKGROUND OF THE INVENTION

The subject matter disclosed herein relates to transmission systems, and more specifically to a hardware serial link fault detection system for a data transmission system.

Generally, data transmission systems may be utilized to transfer data from one input/output (I/O) device to another. For example, a transmission system may be utilized in industrial control systems to facilitate the communication between various industrial controllers, which interface with and control a variety of devices such as turbines, generators, compressors, combustors, and the like. More specifically, the transmission system may enable controllers to communicate data, such as control commands, with one another. For example, a first controller may transmit a control command to a second controller to start operation of a turbine via the transmission system. Accordingly, it would be beneficial to improve the reliability of transmission systems.

BRIEF DESCRIPTION OF THE INVENTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

A first embodiment describes a method for real time error correction in a data transmission system that includes receiving a first communication signal on a first programmable logic device from a second programmable logic device via a first serial link, receiving a second communication signal on the first programmable logic device from the second programmable logic device via a second serial link, in which the first serial link and the second serial link are disposed in parallel with each other and are configured to communicate over a single conduit, and the first communication signal and the second communication signal are representative of identical information. The method further includes comparing the first communication signal and the second communication signal in the first programmable logic device to detect an error in data in the first communication signal, the second communication signal, or both, and when the error is detected, correcting the error in real time in the first programmable logic device based at least in part on the comparison of the first communication signal and the second communication signal.

A second embodiment describes a data transmission system including a programmable logic device. The programmable logic device includes a first serial port communicatively coupled to a first serial link, in which the first serial port receives a first transmission signal from the first serial link, and a second serial port communicatively coupled to a second serial link, in which the second serial port receives a second transmission signal from the second serial link. The first serial link and the second serial link are disposed in parallel with each other and communicate over a single conduit, and the first communication signal and the second communication signal are representative of identical information. The programmable logic device further includes circuitry to compare the first communication signal and the second communication signal to detect an error in a data included in the first communication signal, the second communication signal, or both, and when the error is detected, correct the error in real time based at least in part on the comparison of the first communication signal and the second communication signal.

A third embodiment describes a method for operating a data transmission system that includes detecting an error in data represented in a first communication signal, a second communication signal, or both in a programmable logic device by comparing the first communication signal transmitted and the second communication signal, in which the first communication signal and the second communication signal are received in parallel by the programmable logic device, the first communication signal and the second communication signal are representative of identical information, and detecting the error includes only hardware detection in the programmable logic device. The method further includes determining a type of the error when the error is detected, and correcting the error in the programmable logic device based at least in part on the type of error, the first communication signal, the second communication signal, or any combination thereof.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Figure 1:
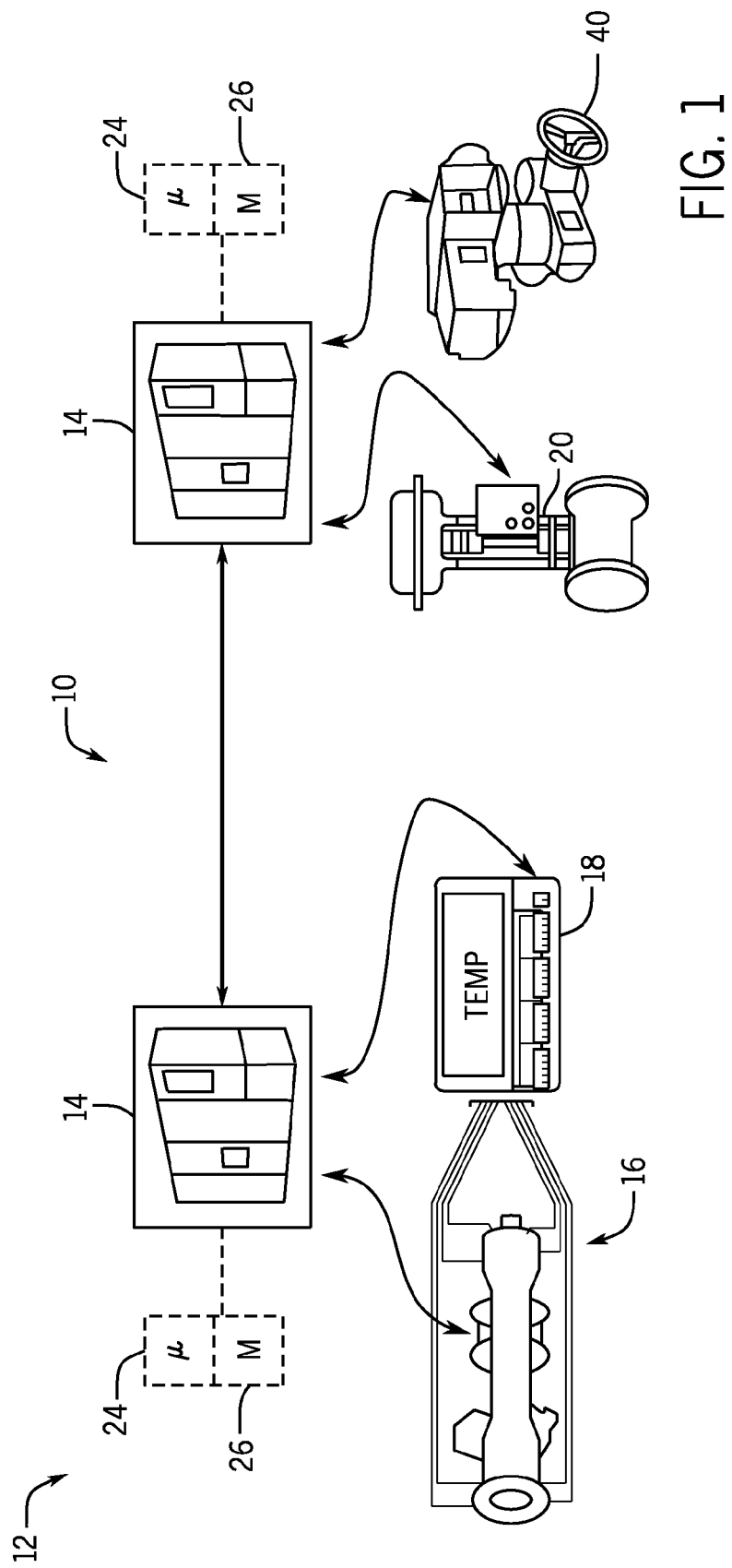
FIG. 1 is a schematic diagram of a data transmission system, in accordance with an embodiment.

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Data transmission systems are often utilized in a system, such as industrial control systems and automation systems, to facilitate communication between various input/output (I/O) devices within the system. For example, a data transmission system may enable various controllers to communicate data with each other. Generally, controllers interface with and control a variety of devices such as turbines, generators, compressors, combustors, sensors, pumps, valves, other field devices and the like. Accordingly, the data communicated by a controller may include data gathered by controlled devices, control commands, device statuses, and the like. Due to the nature of systems that may utilize data transmission systems, it would be beneficial to improve the reliability of such data transmission systems.

One technique to improve the reliability of data transmission systems may include utilizing various communication protocols such as Object Linking and Embedding for Process Control (OPC), Modbus, Foundation Fieldbus, Process Field Bus, and/or BACnet. Generally, these communication protocols may use some software oversight and processing. For example, when utilizing Foundation Fieldbus, a certain level of processing may be utilized to execute function blocks for transmitting and receiving data. However, because some I/O devices may not include the desired processing capabilities for such protocols, the present disclosure includes embodiments to improve reliability of transmission systems for I/O devices regardless of processing capabilities. Accordingly, the techniques described herein provide for a low level serial link for communications in various applications, including safety system applications. The low level serial link may use less processing and resources (e.g., software and hardware resources) yet provide suitable operations to meet desired safety integrity level (SIL) certifications, including SIL 1, 2, 3, and/or 4. In certain embodiments, the low level serial link may apply a hardware fault detection scheme to provide the desired safety certification, suitable for reducing the use of processing and other resources.

Accordingly, a first embodiment describes a fault tolerant transmission system that includes a programmable logic device. The programmable logic device includes a first serial port communicatively coupled to a first serial link, in which the first serial port receives a first transmission signal from the first serial link, and a second serial port communicatively coupled to a second serial link, in which the second serial port receives a second transmission signal from the second serial link. The first serial link and the second serial link are disposed in parallel with each other and communicate over a first single conduit, and the first communication signal and the second communication signal are representative of identical information. The programmable logic device further includes circuitry that detects a fault in the first serial link, the second serial link, or both by comparing the first communication signal and the second, and if a fault is detected, determines whether the transmission system can continue operation despite the fault. In other words, receiving parallel communication signals representative of the same information enables the detection of faults in a communication link (e.g., serial link) between various devices. Moreover, the transmission system may be more fault tolerant by intelligently reacting to detected faults.

Additionally, a second embodiment describes a data transmission system including a programmable logic device. The programmable logic device includes a first serial port communicatively coupled to a first serial link, in which the first serial port receives a first transmission signal from the first serial link, and a second serial port communicatively coupled to a second serial link, in which the second serial port receives a second transmission signal from the second serial link. The first serial link and the second serial link are disposed in parallel with each other and communicate over a single conduit, and the first communication signal and the second communication signal are representative of identical information. The programmable logic device further includes circuitry to compare the first communication signal and the second communication signal to detect an error in a data included in the first communication signal, the second communication signal, or both, and when the error is detected, correct the error in real time based at least in part on the comparison of the first communication signal and the second communication signal. In other words, receiving parallel communication signals representative of the same information enables the detection and real-time correction of the errors in the communication signals. As used herein, "real-time" is intended to mean immediately following the preceding step. For example, error correction may begin as soon as an error is detected.

As will be described in more detail below, in some embodiments, the data transmission system may utilize hardware with little or no software oversight to improve the reliability of the transmission system. Accordingly, improved reliability of the data transmission system may be provided to I/O devices having processors and those without. Furthermore, the techniques described herein enable I/O devices to comply with International Electrotechnical Commission (IEC) 61508, and in some embodiments, meet SIL 1, 2, 3, and/or 4 certifications.

By way of introduction, FIG. 1 depicts an embodiment of a data transmission system 10 disposed in an industrial control system 12. The industrial control system 12 includes multiple controllers 14 that each may interface with and control various devices in the industrial control system 12. As depicted, a first controller is coupled to and controls a turbine 16 (e.g., gas turbine, steam turbine, hydroturbine) and is communicatively coupled to a sensor 18, and a second controller is coupled to and controls a valve 20 and a pump 22. In other embodiments, the controllers 14 may be coupled to and control other devices in the industrial control system 12, such as combustors, generators, and other turbo machinery.

Furthermore, as depicted, the controllers 14 may communicate with one another via the data transmission system 10. In some embodiments of an industrial control system 12, the data transmission system 10 may include a high speed Ethernet (HSE) network or an H1 network. However, as will be described in more detail below, the techniques described herein may utilize any serial point-to-point architecture. By utilizing the data transmission system 10, the controllers 14 may communicate various types of data, such as a status of connected devices, measurements collected, and control commands. For example, the first controller may transmit measurements collected by the sensor 18 to the second controller via the data transmission system 10. In response, the second controller may transmit a control command instructing the first controller to modify operation of the turbine 16. Accordingly, to facilitate communication, control of connected devices, and other various functions of the controller, the controllers 14 include one or more processors 24 and memory 26, which may store non-transitory machine-readable instructions executable by the one or more processors 24.

Figure 2:
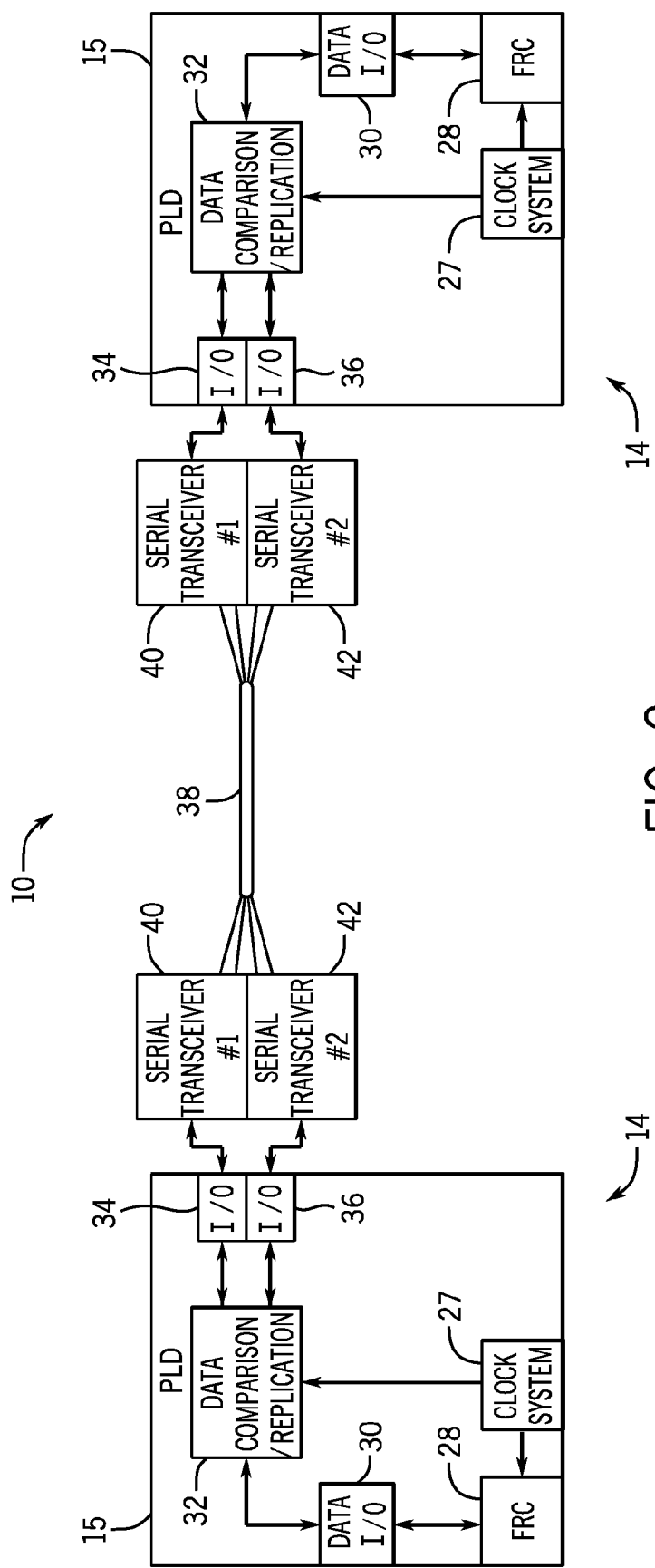
FIG. 2 is a block diagram of controllers in the data transmission system depicted in FIG. 1, in accordance with an embodiment.

A detailed view of an embodiment of the data transmission system 10 is depicted in FIG. 2. As depicted, each controller 14 includes a data transmission subsystem 15. In some embodiment, the data transmission subsystem 15 may be a programmable logic device, such as a field programmable gate array, a programmable array logic, a programmable logic array, a generic array logic, or any combination thereof. In other embodiments, the subsystem 15 may be an application specific integrated circuit. Additionally, the data transmission subsystem 15 may be included as a hardware subsystem of each controller 14 (e.g., as a hot swappable card). One example of the controller 14 that may include the subsystem 15 is a Mark VIe Control System made available by General Electric Company of Schenectady, N.Y.

In the depicted embodiment, the functions performed by the data transmission subsystem 15 are represented as functional blocks, which may be performed by the controller processor 24 and/or memory 26. As depicted, the subsystem 15 includes a clock system (functional block 27), a free running counter (FRC) (functional block 28), a data I/O (functional block 30), a data comparison/replication (functional block 32), and parallel I/O ports (functional blocks 34 and 36) that couple the controllers 14 to the data transmission system 10. As will be described in more detail below, the FRC 28 may generate timing data to enable time synchronization of communication signals; the data I/O 30 may generate communication signals; and the data comparison/replication 32 may replicate communication signals, detect faults in a communication link (e.g., serial link), and detect/correct errors in received communication signals.

Furthermore, as depicted, the transmission system 10 includes a single conduit (e.g., cable) 38 and parallel serial transceivers 40 and 42 coupled to either end of the conduit 38. More specifically, the serial transceivers 40 and 42 interface with the I/O ports 34 and 36 to enable the controllers 14 to communicate with other controllers 14 via the subsystem 15. The serial transceivers 40 and 42 may be RS-232 transceivers, RS-485 transceivers, differential bus transceivers, single ended transceivers, or other low level serial transceivers. In some embodiments, only one cable (e.g., Cat 5, Cat 5e, or Cat 6) is used to connect the two subsystems 15, thus minimizing conduit and related equipment. In other embodiments, multiple cables may be used. In some embodiments, the serial transceivers 40 and 42 may transmit communication signals at frequencies lower than radio frequencies to minimize the amount of noise in the signals caused by radio frequencies. For example, the serial transceivers 40 and 42 may communicate between 1-20 MHz, 20-30 MHz, 30-40 MHz, 40-50 MHz, 50-60, 60-100 MHz, or any combination thereof to enable data transmission between 1-20 Mbits/second, 20-30 Mbits/second, 30-40 Mbits/second, 40-50 Mbits/second, 50-60 Mbits/second, 60-100 Mbits/second or any combination thereof.

Although not explicitly depicted, the single conduit 38 includes a first serial link that couples serial transceivers 40 and a second serial link that couples serial transceivers 42 in parallel. More specifically, the first and second serial link may enable the parallel transmission of communication signals between the controllers 14. For example, a first communication signal may be transmitted via the first serial link and a second communication signal may be transmitted via the second serial link in parallel and at substantially the same time. As will be described in more detail below, the first communication signal and the second communication signal may be representative of the same information, which facilitates the detection of faults in the serial links and the detection/correction of errors in the communication signals. In some embodiments, a suitable conduit 38 may be a Category 5 (Cat5) cable because it includes eight serial wires, which enables four wires to be used for the first serial link and four wires to be used for the second serial link. In other embodiments, the first serial link and the second serial link may be included on separate conduits. Moreover, as depicted, the single conduit 38 couples one controller to another, thus setting up a serial point-to-point architecture. As used herein, "point-to-point architecture" is intended to describe when one device is directly coupled another device. In other words, in some embodiments, the controllers 14 may communicate exclusively via the conduit 38, which enables both controllers 14 to predetermine (e.g., anticipate or expect) identity of the other controller 14, the transmission time of a communication signal, the sequence of communication signals, or any combination thereof. Such an architecture may be suitable for communication between devices located 1-10 meters apart, 10-20 meters apart, 20-30 meters apart, 30-40 meters apart, 40-100 meters apart, or any combination thereof.

Figure 3:
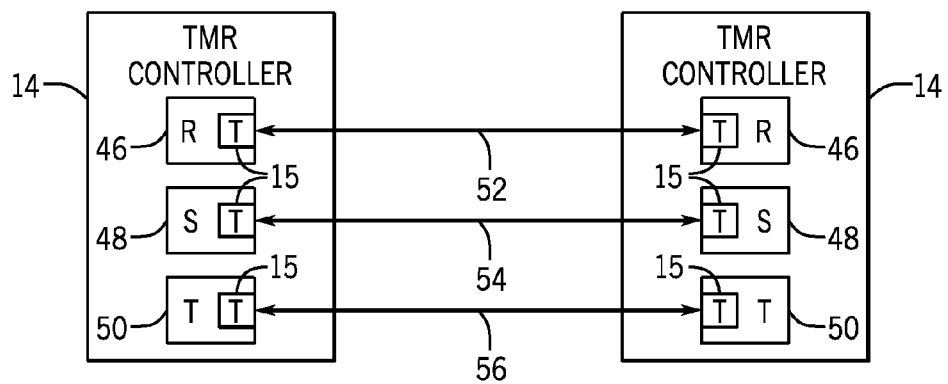
FIG. 3 is a block diagram of a triple modular redundancy controller, in accordance with an embodiment.

In some embodiments, the controllers 14 may be triple modular redundancy (TMR) controllers 14 as depicted in FIG. 3. Generally, TMR controllers 14 may improve reliability by utilizing three cores. More specifically, as depicted, TMR controllers 14 include an R core 46, an S core 48, and a T core 50 that each functions substantially the same. Thus, the TMR controllers 14 operate through a voting scheme to reduce the effect of a malfunctioning core (e.g., 46, 48, or 50).

As depicted, the R cores 46 in the TMR controller 14 are coupled by a first transmission system 52, the S cores 48 are coupled by a second transmission system 54, and the T courses are coupled by a third transmission system 56. More specifically, in some embodiments, each of the transmission systems (e.g., 52, 54, and 56) may function similar to the data transmission system 10 described above, for example, by including data transmission subsystem 15 and operating substantially independent from one another. More specifically, each transmission system (e.g., 52, 54, and 56) may include a first and a second serial link (or any other component of the subsystem 15) to enable parallel transmission of communication signals between each pair of cores. In other words, the first transmission system 52 may transmit parallel communication signals (e.g., two or more identical data transmissions) between the R cores 46, the second transmission system 54 may transmit parallel communication signals between the S cores 48, and the third transmission system 56 may transmit parallel communication signals between the T cores 50. Additionally, as described above, the first and second serial links may be included in a single or two separate conduits. Accordingly, in the embodiment depicted in FIG. 3, three separate conduits or six separate conduits may be utilized. Alternatively, all six of the serial links may be included in a single conduit.

Figure 4:
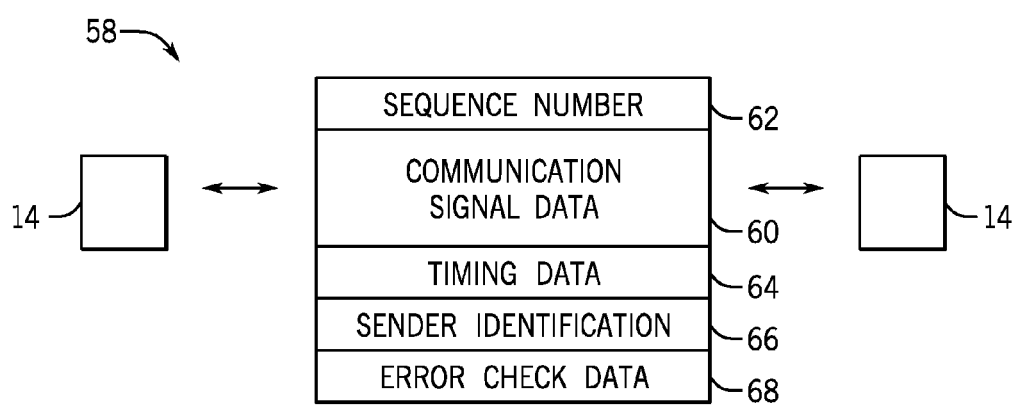
FIG. 4 is a block diagram of a communication signal, in accordance with an embodiment.

An embodiment of a communication signal 58 that may be transmitted between the controllers 14 via the data transmission system 10 is depicted in FIG. 4. As depicted, the communication signal 58 includes a communication signal data 60, a sequence number 62, a timing data 64, a sender identification 66, and error check data 68. The communication signal data 60 may include the data intended to be communicated between the controllers 14. For example, the communication signal data 60 may include control commands, login data, authentication data, voting data, measurement data, device statuses, and the like.

The sequence number 62 may represent the order the communication signal 58 was transmitted. In some embodiments, the sequence number 62 may be included in the header of the communication signal 58. Accordingly, the sequence number 58 may enable a receiving controller 14 to determine the order communication signals 58 were transmitted.

As described above, the timing data 64 may be generated by the FRC 28 to enable time synchronization of the communication signal 58. For example, in some embodiments, the timing data 64 may be a unique character representative of the count in the FRC 28. Thus, if the FRC 28 in the transmitting and receiving controllers 14 are synchronized, the timing data 64 enables the receiving controller 14 to determine when the communication signal 58 was transmitted.

The sender identification 66 may identify the transmitting controller 14. For example, in some embodiments, the sender identification may be a media access control (MAC) address, a proprietary unique module identification code, or other similar unique identifier. In some embodiments, the proprietary unique module identification code may include a unique serial number containing a date code. Accordingly, the sender identification 66 may enable the receiving controller 14 to determine the identity of the transmitting controller 14.

The error check data 68 may include data that facilitates error check techniques, such as a cyclic redundancy check, a checksum, a cryptographic hash function, or the like. For example, when a cyclic redundancy check is utilized, the error check data 68 may include a remainder of a polynomial division of the communication signal 58. In operation, the transmitting controller 14 may perform the error check technique and encode the error check data 68 (e.g., checksum) on the communication signal 58. Accordingly, the receiving controller 14 may detect errors/faults by repeating the error check technique and matching the result with the error check data 68 (e.g., calculating the checksum anew and verifying the calculation with the transmitted checksum).

Figure 5:
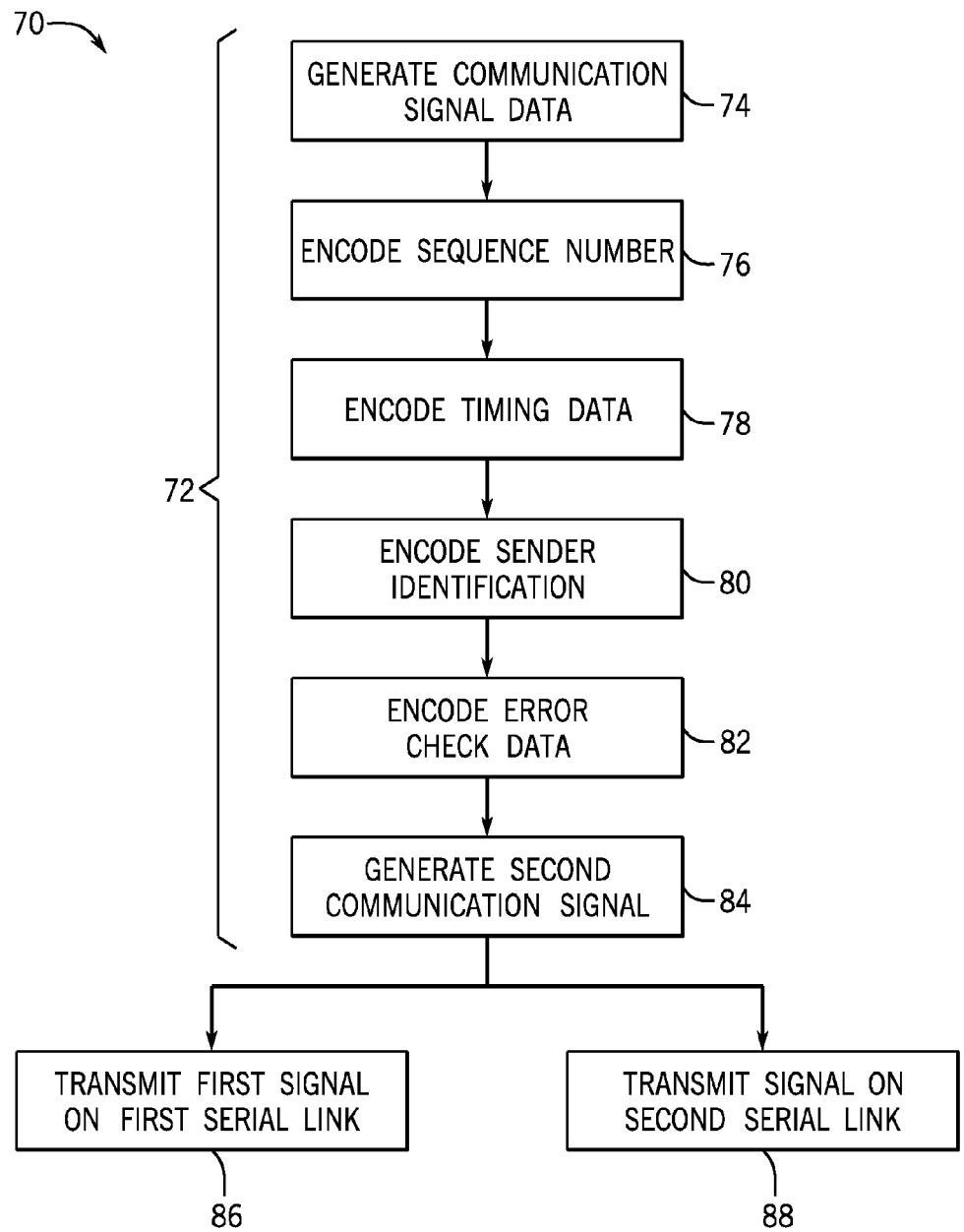
FIG. 5 is a flowchart depicting a process to transmit communication signals to a data transmission system, in accordance with an embodiment.

As described above, the transmission system 10 enables communication signals 58 to be transmitted between controllers 14. FIG. 5 depicts one embodiment of a process 70 that may be utilized by a transmitting controller 14, and more specifically the data transmission subsystem 15 (e.g., programmable logic device), to transmit parallel communication signals. The process 70 may be implemented by non-transitory machine-readable instructions or code stored in the memory 26 and executed by the processor 24. In the depicted embodiment, the process 70 begins by generating the first communication signal (bracket 72), which includes generating the communication signal data (process block 74), encoding a sequence number (process block 76), encoding timing data (process block 78), encoding a sender identification (process block 80), and encoding error data (process block 82). The process 70 continues by generating the second communication signal (process block 84), and transmitting the first communication signal on the first serial link (process block 86) and the second communication signal on the second serial link (process block 88) in parallel.

More specifically, the first communication signal may be generated by the data I/O 30. To generate the communication signal data 60 (process block 74), the data I/O 30 may gather the data to be transmitted on the first communication signal. For example, when a device status is to be transmitted, the data I/O 30 may poll a connected device (e.g., 16, 20 or 22) for its status or retrieve measurements from sensors (e.g., 18) that monitor the device. To encode the sequence number 62 (process block 76), the data I/O 30 may include a sequential counter that increments with each communication signal transmitted. Thus, the count from the counter may be included as the sequence number 62 to represent the order a communication signal 58 is transmitted. To encode the sender identification 66 (process block 80), the data I/O 30 may retrieve a stored unique identifier identifying the transmitting controller from the transmitting controller's memory 26.

To encode the timing data 64 (process block 78), the data I/O 30 may receive the timing data 64 from the FRC 28. More specifically, the FRC 28 may generate the timing data 64 based on a timing signal received from the system clock 27. For example, the FRC 28 may count up based on the timing signal and reset the count once it reaches a particular count. Based on the count when the communication signal 58 is to be transmitted, the FRC 28 may output a unique character that represents the count. Thus, when a communication signal 58 is received, the receiving controller may compare the unique character to the count in its own FRC 28 to determine when the communication signal 58 was transmitted.

To encode the error check data 68 (process block 82), the data I/O 30 may perform a data checking method, such as a cyclic redundancy check, a checksum, a cryptographic hash function, or the like. For example, when a cyclic redundancy check is utilized, the data I/O 30 may perform a polynomial division on the communication signal 58, or more specifically the communication signal data 60, and encode the remainder of the division as the error check data 68. Thus, the receiving controller 14 may detect errors by repeating the error check technique and matching the result with the error check data 68. In other embodiments, encoding the sequence number 62 (process block 76), encoding the timing data 64 (process block 76), encoding the sender identification 66 (process block 76), and encoding the error check data 68 (process block 76) may be performed in any order.

The first communication signal may then be passed from the data I/O 30 to the data comparison/replication 32 to generate the second communication signal (process block 84). More specifically, the data comparison/replication 32 may generate the second communication signal to represent the same information as the first communication signal, for example, by copying the first communication signal. Additionally or alternatively, to generate the second communication signal, the data comparison/replication 32 may invert the first communication signal (e.g., change a "1" to a "0" and vice versa) or reverse the first communication signal (e.g., put most significant bit of the first communication signal as the least significant bit of the second communication signal and so on). For example, if the first communication signal is "10011100" a reversed second communication signal may be "00111001" and an inverted second signal may be "01100011."

Reversing and/or inverting the first communication signal may facilitate detecting faults in the serial links and/or detecting/correcting errors in the data transmitted. For example, when the communication signals are inverted, an error in one of the communication signals may be detected if a bit in the first and second communication signals are both "high" or both "low." Additionally, when the second communication signal is reversed, an error may be detected if the most significant bit of the first communication signal does not match the least significant bit of the second communication signal. Furthermore, the error may be corrected by replacing an erroneous bit on the first communication signal with a non-erroneous bit from the second communication signal.

The first communication signal may be passed from the data comparison/replication 32 to the first I/O port 34 to be transmitted via the first serial link (process block 86), and the second communication signal may be passed from the data comparison/replication 32 to the second I/O port 36 via the second serial link (process block 88). As will be described in more detail below, to facilitate serial link fault detection and data error detection/correction, the first communication signal and the second communication signal may be transmitted in parallel and substantially simultaneously.

Figure 6:
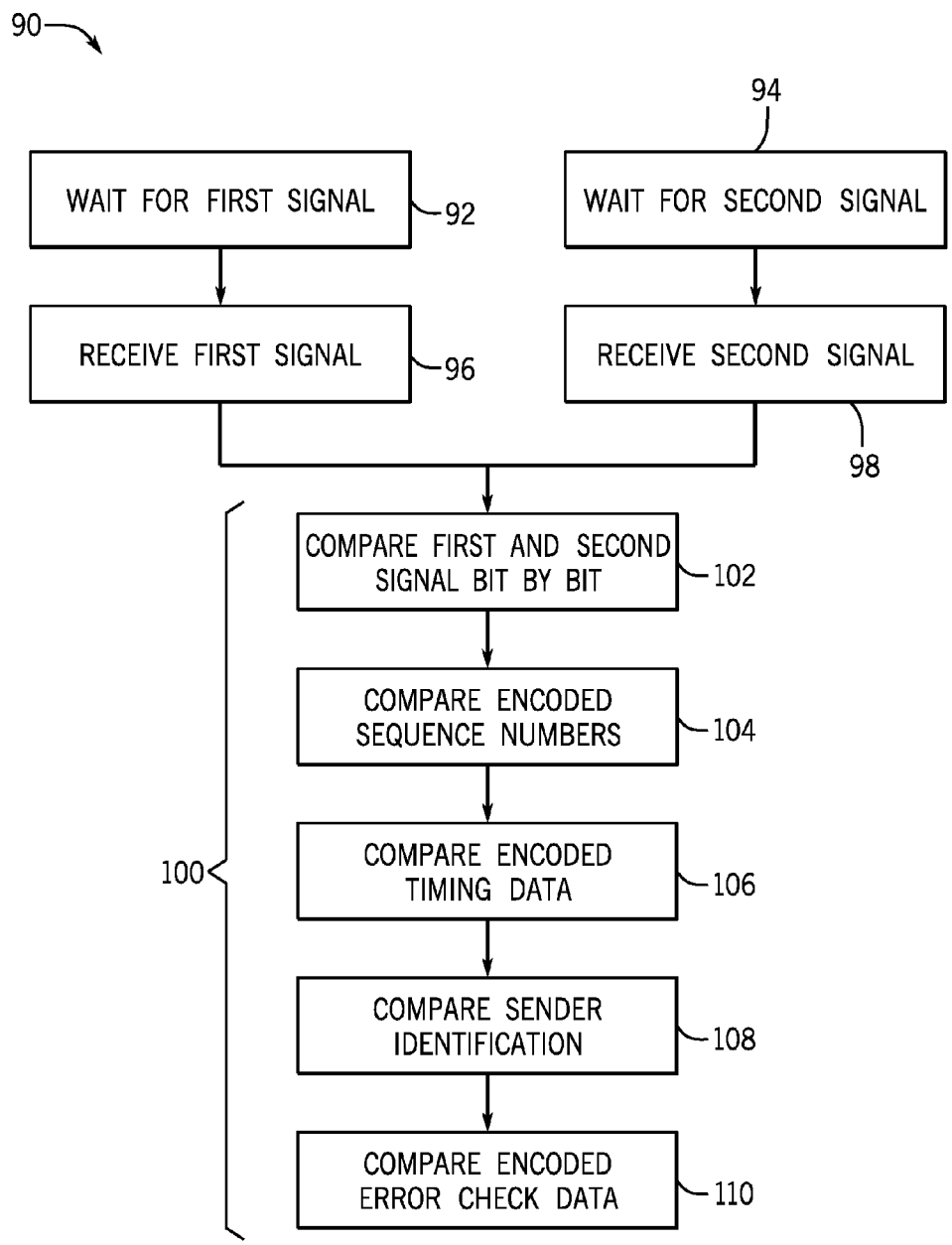
FIG. 6 is a flowchart depicting a process to receive communication signals from a data transmission system, in accordance with an embodiment.

On the receiving side of the transmission system 10, the transmitted communication signal 58 is received by the receiving controller 14. FIG. 6 depicts an embodiment of a process 90 that may be utilized by the receiving controller 14, and more specifically the data transmission subsystem 15 (e.g., programmable logic device), to receive parallel communication signals 58, for example on a single conduit (e.g., Cat 5 cable). The process 90 may be implemented by non-transitory machine-readable instructions or code stored in the memory 26 and executed by the processor 24. As depicted, the process 90 begins by waiting for a first communication signal (process block 92) and waiting for a second communication signal (process block 94). If the first communication signal is received (process block 96) and the second communication signal is received (process block 98), the first and second communication signals are compared (bracket 100), which may include comparing the first and second communication signals for bit by bit agreement (process block 102), comparing the encoded sequence numbers (process block 104), comparing the encoded timing data (process block 106), comparing the sender identification (process block 108), and comparing the encoded error check data (process block 110).

More specifically, the data comparison/replication 32 may wait to receive the first communication signal via the first I/O port 34 (process block 92), and to receive the second communication signal via the second I/O port 36 (process block 94). In some embodiments, this may include employing a watchdog timeout for regularly scheduled communication signals 58. In other words, the data comparison/replication 32 may wait a predetermined amount of time, such an expected arrival time for a scheduled communication signal 58, and if the communication signal 58 is not received within that amount of time, the data comparison/replication signal 58 may output a timeout signal. In some embodiments, the expected arrival time may be predetermined by the receiving controller 14 because utilizing a point-to-point architecture, as described above, may enable the controller 14 to look at the actual arrival time of previous communication signals 58. Accordingly, as depicted in FIG. 2, the data comparison/ replication 32 is coupled to the clock system 27 to receive a timing signal. In some embodiments, a communication signal 58 is expected every 1-5 milliseconds, 5-8 milliseconds, 8-10 milliseconds, 10-12 milliseconds, 12-15 milliseconds, 15-30 milliseconds, or any combination thereof. Accordingly, the output of a timeout signal may indicate that a communication signal 58 has been deleted or delayed.

Once both the first and the second communication signal are received, the data comparison/replication 32 may begin to compare the first and second communication signals (bracket 100), which may facilitate the detection of faults in the serial links and detection/correction of errors in the transmitted data. More specifically, to compare the first communication signal and the second communication signal for bit by bit agreement (process block 102), the data comparison/replication 32 may invert or reverse the second communication signal before comparing it with the first communication signal because, as described above, the second communication signal may be a reversed or inverted version of the first communication signal. Accordingly, the bit by bit comparison may indicate that a bit in the communication signal 58 has been deleted, inserted, or corrupted. Additionally, as will be described in more detail below, the bit by bit comparison may facilitate real-time correction of a bit in the communication signal 58.

To compare the encoded sequence number 62 (process block 104), the data comparison/replication 32 may retrieve the sequence number 62 from the header of the communication signal 58, which enables the controller 14 to determine the order the communication signal 58 was transmitted. More specifically, the data comparison/replication 32 may compare the sequence number 62 encoded on one or both of the first and second communication signals to an expected sequence number 62. For example, a repetition error may be detected if the sequence numbers 62 encoded on the communication signals 58 are the same as a previous pair of communication signals. Additionally, a deletion, insertion or resequence error may be detected if the sequence numbers 62 encoded on the communication signals 58 are different from the expected sequence number. In some embodiments, utilizing a point-to-point serial architecture, as described above, may enable the receiving controller 14 to maintain the expected sequence number because, if there are no errors, the sequence number 62 encoded on each communication signal 58 received will have a predetermine relationship with the sequence number 62 encoded on a previously received communication signal 58. Accordingly, comparing the sequence number 62 may indicate that one or both of the communication signals 58 is repeated, deleted, inserted, or resequenced.

To compare the encoded timing data 64 (process block 106), the data comparison/replication 32 may time synchronize one or both of the first communication signal and the second communication signal. In some embodiments, this may include determining the time the communication signals 58 were transmitted by matching the timing data 64 encoded on the communication signals 58 with the stored timing data 64 in memory 26 generated by the FRC 28 on the receiving controller 14. For example, the FRC 28 on both the transmitting and receiving controller may generate a unique character "X" to indicate 3:00 pm. Additionally, a repetition error may be detected if the timing data 64 encoded on the communication signals 58 is the same as the timing data 64 encoded on a previously received communication signal 58. Furthermore, a resequence or delay error may be detected if the timing data encoded on the communication signals 58 is earlier than the timing data 64 encoded on a previously received communication signal 58. Thus, comparing the encoded timing data 64 may indicate that one or both of the communication signals 58 is repeated, resequenced, or delayed.

To compare the sender identification 66 (process block 108), the data comparison/replication 32 may determine the identity of the transmitting controller 14. More specifically, this may include matching the sender identification 66 encoded on one or both of the first communication signal and the second communication signal with a sender identification 66 stored in memory 26. For example, the controller memory 26 may store a list of sender identifications 66 that correspond to devices that the controller expects to receive communication signals 58 from. In some embodiments, utilizing a point-to-point serial architecture, as described above, may enable the receiving controller 14 to predetermine what devices the controller 14 is coupled to and store the sender identifications associated with those devices. Accordingly, comparing the encoded sender identification 66 may indicate that one or both of the communication signals 58 is inserted if the encoded sender identification 66 corresponds to a device that the controller 14 does not expect to receive communication signals 58 from.

To compare the encoded error check data 68 (process block 110), the data comparison/replication 32 may perform an error check technique, such as a cyclic redundancy check (CRC), on one or both of the first communication signal and the second communication to determine whether the received communication signals 58 are corrupted. More specifically, the data comparison/replication 32 may replicate the error check technique performed in the transmitting controller 14 and compare its results with the encoded error check data 68. Accordingly, comparing the encoded error check data 68 may indicate that one or both of the communication signals 58 is corrupted or otherwise do not match each other.

In other embodiments, comparing the communication signals bit by bit (process block 102), comparing the encoded sequence numbers 62 (process block 104), comparing the encoded timing data 64 (process block 106), comparing the sender identification 66 (process block 108), and comparing the error check data 68 (process block 110) may be performed in any order. Moreover, in certain embodiments, detection of an insertion, deletion, delay, or any combination thereof may indicate a masquerade. As used herein, a masquerade is intended to describe an unauthenticated intrusion into the transmission system 10. For example, when a communication signal 58 is inserted, deleted, or delayed, this may indicate that an unauthorized device (e.g., controller 14) is accessing the transmission system 10 and altering the communication signals 58.

Figure 7:
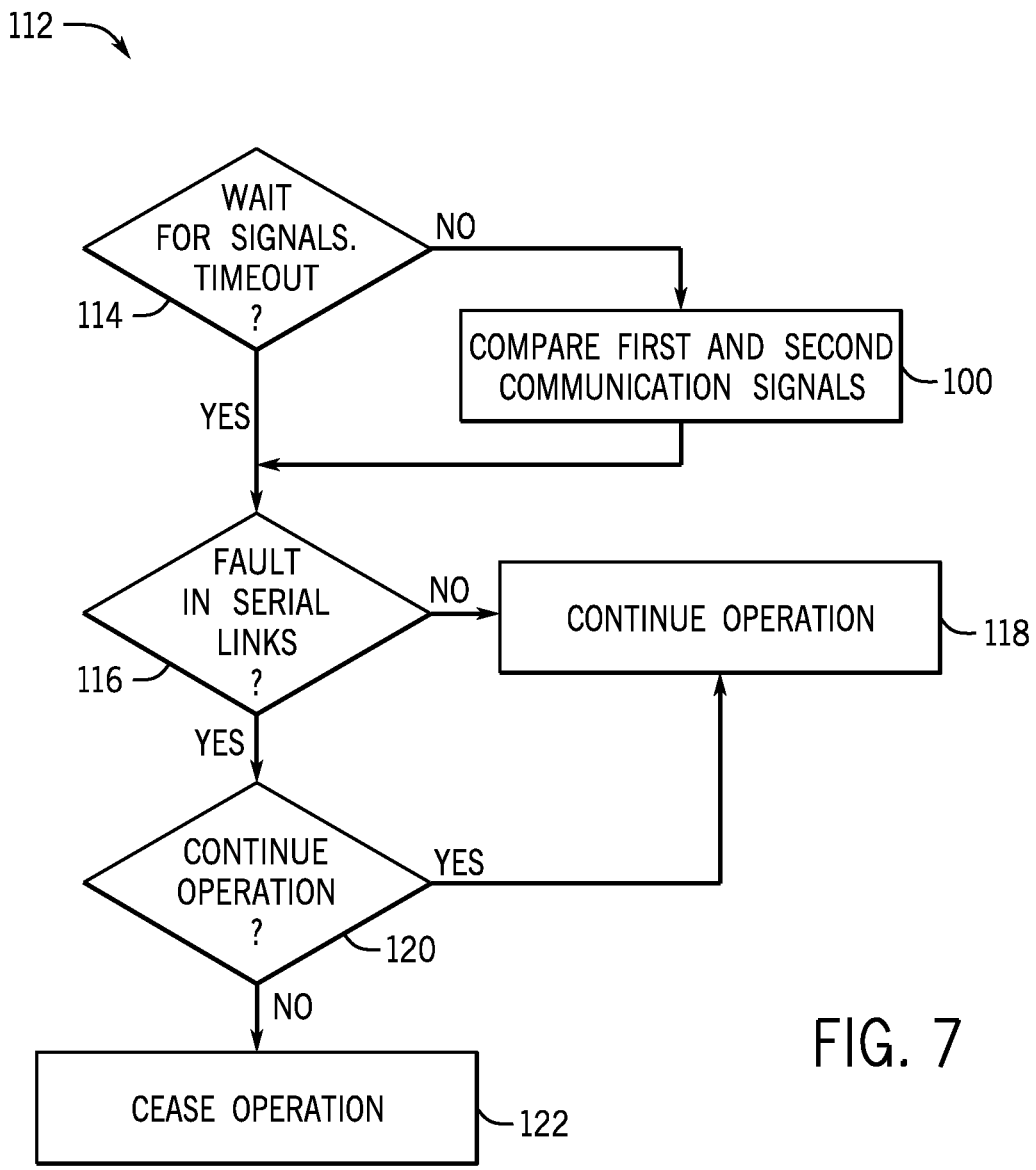
FIG. 7 is a flowchart depicting a process to detect a fault in a serial link, in accordance with an embodiment.

As described above, transmitting a first communication signal and a second communication signal representative of substantially identical information in parallel via the first and second serial link respectively enables the detection of faults and/or masquerades in the first serial link, the second serial link, or both. One embodiment of a process 112 that may be utilized to detect faults in the serial links is depicted in FIG. 7. The process 112 may be implemented by non-transitory machine-readable instructions or code stored in the memory 26 and executed by the processor 24. As depicted, the process 112 may begin by waiting for the first and second communication signal (decision block 114). If both communication signals are received, the first and second communication signals may be compared (process block 100). Based on whether a timeout signal is output and/or the comparison of the communication signals, a fault in the serial link may be detected (decision block 116). If no fault in the serial link is detected, the transmission system 10 continues operation (process block 118). On the other hand, if a fault is detected, it may be determined (decision block 120) whether the transmission system 10 should continue operation despite the detected fault (process block 118) or cease operation (process block 122).

More specifically, as described above, the data comparison/replication 32 may wait a specified amount of time, such as a communication signal frame, for the communication signals 58 (process block 114). If one or both of the communication signals 58 is not received, the data comparison/replication 32 may output a timeout signal indicating that one or both of the communication signals 58 has timed out. On the other hand, if both signal 58 are received within the specified amount of time, the data comparison/replication 32 may compare the communication signals 58 (process block 100), which may include comparing the first and second communication signals 58 for bit by bit agreement (process block 102), comparing the encoded sequence numbers (process block 104), comparing the encoded timing data (process block 106), comparing the sender identification (process block 108), and comparing the encoded error check data (process block 110). As described above, comparing the communications signals may facilitate the detection of errors in data transmitted in the communication signals.

Based on the comparison of the communication signals 58 and/or whether a timeout signal was output, the data comparison/replication 32 may determine whether a fault is present in the first serial link, the second serial link, or both (decision block 116). For example, if the first communication signal has timed out, but the second communication signal has not, the data comparison/replication 32 may determine that the first serial link has a fault. Additionally, any error (e.g., repetition, deletion, insertion, resequence, corruption, delay, or masquerade) may indicate a fault in one or more of the serial links. For example, corruption of the first communication signal 58 but not the second communication signal 58 may indicate that the insulation on the first serial link is weakened and susceptible to external interference, such as stray electromagnetic waves.

Furthermore, in some embodiments, when a fault in a serial link is detected, the status of the serial link may be updated based on the fault. For example, before a fault is detected, the status of the first serial link and the second serial link is set to "good," but when a fault in the first serial link is detected, the status of the first serial link may be updated to "faulty." As will be described further below, in other embodiments, the status may include intermediate statuses to enable the transmission system 10 to more judiciously manage operation. For example, a serial link may have a status of "partially faulty" or "potentially faulty" if only a single error is detected or if an error is only detected periodically (e.g., not in every communication signal transmitted). For example, when a first error is detected, the status may be updated from "functional" to "potentially faulty," and when a second error is detected three communication signals later, the status may again be updated to "faulty."

If a fault is detected, the data comparison/replication 32 may more judiciously determine whether to cease or continue operation of the transmission system based on the circumstances associated with the fault (decision block 120). In other words, the transmission system 10 may become more fault tolerant and not immediately shut down each time a fault in the serial links is detected. In some embodiments, the decision whether to continue operation may depend on the status of the serial links and the information included in the communication signal 58. For example, if the first serial link is "functional" but the second serial link is "faulty" and the communication signal 58 merely communicates a temperature measurement, the transmission system 10 may continue operations solely based on the communication signals 58 received via the first serial link. In such an embodiment, the controller 14 may decide to continue transmitting and receiving sensor 18 measurements but may decide to cease transmission/reception of control commands.

Additionally, other factors influencing the decision whether to continue operation of the transmission system 10 may include the nature of the system utilizing the transmission system 10 and history of the errors in the communication signals. For example, a transmission system 10 in a candy manufacturing plant may be more fault tolerant than a nuclear plant and choose to operate with one "functional" serial link and one "potentially faulty" link, whereas the nuclear play may to operate only with two "functional" serial links. Additionally, if there has not been a history of errors, the transmission system 10 may attribute the error to an anomaly and continue operation until a subsequent error is detected. In such embodiments, the transmission system 10 may decide to continue operation for a set period to give an operator an opportunity to correct the faulty serial link, but cease operation if the fault has not been correct after the set period.

Furthermore, the decision whether to continue operation may depend on whether the error is correctable in real-time. For example, if the error is a deletion or a corruption of the most significant bit on both communication signals 58 and the communication signals are reversed, the transmission system 10 may choose to continue operation based on the corrected communication signals 58. The correctability of errors in communication signals 58 will be described in more detail below.

Based on the above described examples, it should be appreciated that the decision whether to continue or cease operation may be customized based on one or more of a variety of factors, such as the nature of the system utilizing the transmissions system 10, the status the serial links, whether an error in the communication signals 58 is correctable in real-time, the nature of the information transmitted in the communication signals 58, the history of errors, and the like. Functions utilized for such determinations may be performed by the data comparison/replication 32 or other systems of the processor 24 and/or memory 26.

Figure 8:
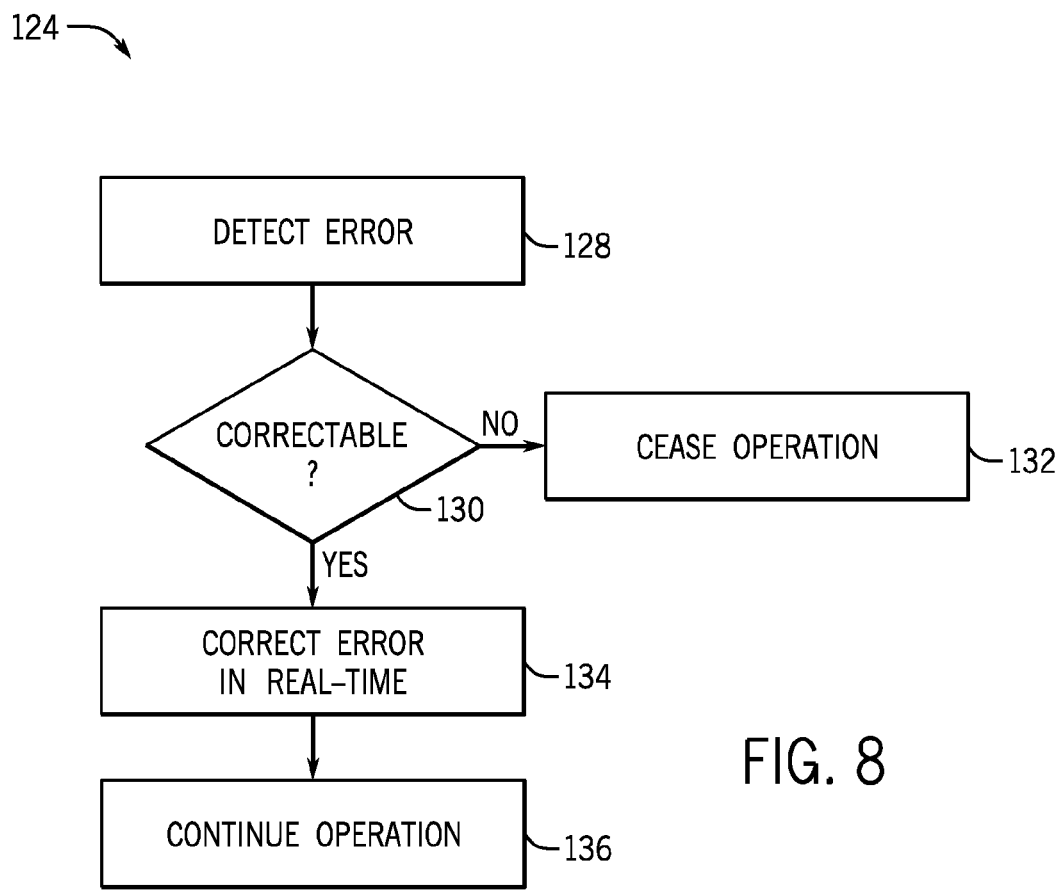
FIG. 8 is a flowchart depicting a process to detect and correct an error in received communication signals, in accordance with an embodiment.

One embodiment of a process 124 for correcting an error in real time is depicted in FIG. 8. The process 124 may be implemented by non-transitory machine-readable instructions or code stored in the memory 26 and executed by the processor 24. As depicted, when an error is detected (process block 126), a determination is made whether the error is correctable (decision block 128). If the error is uncorrectable, the transmission system 10 may cease operation (process block 132). If it is correctable, the error is corrected in real-time (process block 134) and the transmission system 10 continues operation (process block 136).

More specifically, the data comparison/replication 32 may determine whether the error is correctable based on various factors, such as the type of error and the magnitude of the error. For example, in the example described above, if the error is merely corrupting the most significant bit of each communication signal 58 and the communication signals 58 are reversed, the data comparison/replication 32 may correct the error by replacing the most significant bit on the first communication signal with the least significant bit on the second communication signal and vice versa. Additionally, if the error detected is a repetition, the transmission system 10 may correct the error simply by executing the earlier receive communication signals and disregarding the subsequently received. Similarly, if the error detected is an insertion, the transmission system may correct the error simply be disregarding the inserted communication signals 58. On the other hand, if the error detected is a masquerade, the error may not be correctable and the transmission system 10 may choose to cease operation because an intrusion into the transmission system 10 has been detected.

Based on the above described examples, the data comparison/replication 32 may correct errors affecting one or more bits of the first communication signal in real-time by replacing erroneous bits in the first communication signal with non-erroneous bits from the second communication signal. Additionally, the data comparison/replication 32 may correct errors affecting the first communication signal but not the second communication signal by disregarding the first communication signal. Furthermore, the data comparison/replication 32 may correct errors affecting both the first and second communication signal by disregarding both. It should be appreciated that the correctability of a detected error may be fact specific. Functions utilized for such determinations may be performed by the data comparison/replication 32 or other parts of the processor 24 and/or memory 26.

Moreover, the techniques described herein enable the errors to be corrected in real-time or as soon as the error is detected. For example, in the above described examples, the most significant bit of the first communication signal may be replaced with the least significant bit of the second communication signal when they are compared bit by bit, the earlier received communication signal 58 may be executed upon receipt and the subsequently received communication signals may be disregarded upon receipt, and the inserted communication signal 58 may be disregarded upon receipt.

Although the above description describes two parallel serial links, other embodiment may include more than two parallel serial links (e.g., three or four parallel serial links). As can be appreciated, the use of more than two parallel serial links may generally utilize the techniques described above to improve the reliability of data transmission systems 10.

Technical effects of the described embodiments include increasing the reliability of a data transmission system 10. More specifically, the reliability of the data transmission system 10 may be improved by utilizing parallel serial links that each transmits a communication signal 58 representative of the same information in parallel. Based on receipt and comparison of the parallel communication signals 58, faults in the serial links and errors in the communication signals may be detected. Accordingly, the reliability of the transmission system 10 may be improved by making the transmission system 10 more fault tolerant and correcting errors in real time. Additionally, in some embodiments, the detection and/or correction of faults and errors may be provided only with the use of hardware, which enables the improved reliability to be provided to all devices regardless of processing capabilities.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. An industrial control system configured to be communicatively coupled to one or more devices, wherein the industrial control system comprises a data transmission subsystem comprising:
   a first serial port configured to be communicatively coupled to a first serial link, wherein the first serial port is configured to receive a first transmission signal comprising a first plurality of bits via the first serial link;
   a second serial port configured to be communicatively coupled to a second serial link, wherein the second serial port is configured to receive a second transmission signal comprising a second plurality of bits via the second serial link, wherein the first serial link and the second serial link are disposed in parallel with each other and the first transmission signal and the second transmission signal are representative of identical information; and
   circuitry configured to:
      perform a first comparison between the first plurality of bits and the second plurality of bits;
      determine whether an error is present in the first transmission signal and type of the error when present based at least in part on the first comparison; and
      correct the error in real time by adjusting the first plurality of bits based at least in part on the type of the error to enable the industrial control system to control operation of the one or more devices based at least in part on the first plurality of bits.

2. The industrial control system of claim 1, wherein the circuitry is configured to:
  invert each bit in the second plurality of bits before the first comparison when the second transmission signal is an inverse of the first transmission signal; and
  reverse order of the second plurality of bits before the first comparison when the second transmission signal is a reverse of the first transmission signal.

3. The industrial control system of claim 1, wherein the circuitry is configured to:
  perform the first comparison by determining bit to bit agreement between the first plurality of bits and the second plurality of bits; and
  detect that the type of the error is a deletion error, an insertion error, or a corruption error based at least in part on the bit to bit agreement.

4. The industrial control system of claim 1, wherein the circuitry is configured to correct the error by:
  replacing a first bit of the first plurality of bits with a second bit of the second plurality of bits when the deletion error is detected;
  inserting the second bit into the first plurality of bits when the deletion error is detected; and
  deleting the first bit from the first plurality of bits when the insertion error is detected.

5. The industrial control system of claim 1, wherein the circuitry comprises a field-programmable gate array, a programmable array logic, a programmable logic array, a generic array logic, or an application-specific integrated circuit.

6. The industrial control system of claim 1, wherein:
  the first transmission signal comprises a first sequence number, first timing data, a sender identification, error check data, or any combination thereof; and
  the circuitry is configured to:
    determine that the type of the error is a repetition error based at least in part on a second comparison between the first sequence number and a second sequence number encoded on a previously received transmission signal;
    determine that the type of the error is a deletion error, an insertion error, or a resequence error based at least in part on a third comparison between the first sequence number and an expected sequence number stored in the data transmission subsystem;
    determine that the type of the error is the repetition error, the resequence error, or a delay error based at least in part on a fourth comparison between the first timing data and second timing data encoded on the previously received transmission signal;
    determine that the type of the error is the insertion error based at least in part on a fifth comparison between the sender identification and an expected sender identification stored in the data transmission subsystem;
    determine that the error type is a corruption error based at least in part on a sixth comparison between a result from an error check technique performed by the circuitry and the error check data; or
    any combination thereof.

7. A method for controlling operation of one or more devices communicatively coupled to an industrial control system, comprising:
  receiving, using a first programmable logic device in the industrial control system, a first communication signal comprising a first plurality of bits from a second programmable logic device via a first serial link;
  receiving, using the first programmable logic device, a second communication signal comprising a second plurality of bits from the second programmable logic device via a second serial link, wherein the first serial link and the second serial link are disposed in parallel with each other and the first communication signal and the second communication signal are representative of identical information;
  performing, using the first programmable logic device, a first comparison between the first plurality of bits and the second plurality of bits;
  determining, using the first programmable logic device, whether an error is present in the first communication signal and type of the error when present based at least in part on the first comparison; and
  correcting, using the first programmable logic device, the error in real time by adjusting the first plurality of bits based at least in part on the type of the error to enable the industrial control system to control operation of the one or more devices based at least in part on the first plurality of bits.

8. The method of claim 7, comprising:
  inverting, using the first programmable logic device, each bit in the second plurality of bits before the first comparison when the second communication signal is an inverse of the first communication signal; and
  reversing, using the first programmable logic device, order of the second plurality of bits before the first comparison when the second communication signal is a reverse of the first communication signal.

9. The method of claim 7, the type of the error comprises a repetition error, a deletion error, an insertion error, a resequence error, a corruption error, a delay error, a masquerade, or any combination thereof.

10. The method of claim 7, wherein:
  performing the first comparison comprises determining bit by bit agreement between the first plurality of bits and the second plurality of bits; and
  determining the type of the error comprises determining that the error is a deletion error, an insertion error, or a corruption error based at least in part on the bit by bit agreement.

11. The method of claim 10, wherein correcting the error comprises:
  replacing a first bit of the first plurality of bits with a second bit of the second plurality of bits when the deletion error is detected;
  inserting the second bit into the first plurality of bits when the deletion error is detected; and
  deleting the first bit from the first plurality of bits when the insertion error is detected.

12. The method of claim 7, wherein correcting the error in comprises replacing each bit of the first plurality of bits with a corresponding bit of the second plurality of bits.

13. The method of claim 7, comprising:
  performing, using the first programmable logic device, a second comparison between first timing data encoded on the first communication signal and second timing data encoded on a previously received communication signal; and
  determining, using the first programmable logic device, that the type of the error is a repetition error, a resequence error, or a delay error based at least in part on the second comparison.

14. The method of claim 7, comprising:
  performing, using the first programmable logic device, a second comparison between a first sequence number encoded on the first communication signal and an expected sequence number stored in the first programmable logic device;

determining, using the first programmable logic device, that the type of the error is a deletion error, an insertion error, or a resequence error based at least in part on the second comparison;

performing, using the first programmable logic device, a third comparison between the first sequence number and a second sequence number encoded on a previous received communication signal; and determining, using the first programmable logic device, that the type of the error is a repetition error based at least in part on the third comparison.

15. The method of claim 7, comprising:

performing, using the first programmable logic device, a second comparison between a first sender identification encoded on the first communication signal and an expected sender identification stored in the first programmable logic device; and determining, using the first programmable logic device, that the type of the error is an insertion error based at least in part on the second comparison.

16. The method of claim 7, comprising:

performing, using the first programmable logic device, an error check technique on the first communication signal;

performing, using the first programmable logic device, a second comparison between a result of the error check technique with error check data encoded on the first communication signal; and determining, using the first programmable logic device, that the error type is a corruption error based at least in part on the second comparison.

17. The method of claim 16, wherein performing the error check technique comprises performing a cyclic redundancy check.

18. The method claim 7, wherein performing the first comparison comprises comparing the first plurality of bits and the second plurality of bits using only hardware in the first programmable logic device without software oversight.

19. The method of claim 7, wherein a single cable comprises the first serial link and the second serial link.

20. A method for controlling operation of one or more devices communicatively coupled to an industrial control system, comprising:

determining, using circuitry of a programmable logic device, type of an error detected in data, wherein the data is indicated by a first communication signal comprising a first plurality of bits and by a second communication signal comprising a second plurality of bit, determining the type of the error comprises comparing the first plurality of bits and the second plurality of bits, and the first communication signal and the second communication signal are received in parallel by the programmable logic device; and correcting, using the circuitry, the error by adjusting the first plurality of bits based at least in part on the type of error to enable the industrial control system to control operation of the one or more device based at least in part on the first plurality of bits.

* * * * *